(12) United States Patent
Zeller et al.

(10) Patent No.: US 11,709,217 B2
(45) Date of Patent: Jul. 25, 2023

(54) DETERMINING CALIBRATION DATA FOR A RECONSTRUCTION OF IMAGE DATA FROM SCAN DATA ACQUIRED BY MEANS OF A MAGNETIC RESONANCE SYSTEM

(71) Applicant: Siemens Healthcare GmbH, Erlangen (DE)

(72) Inventors: Mario Zeller, Erlangen (DE); Gerald Mattauch, Dormitz (DE)

(73) Assignee: Siemens Healthcare GmbH, Erlangen (DE)

( * ) Notice: Subject to any disclaimer, the term of this patent is extended or adjusted under 35 U.S.C. 154(b) by 13 days.

(21) Appl. No.: 17/490,111

(22) Filed: Sep. 30, 2021

(65) Prior Publication Data

US 2022/0099781 A1 Mar. 31, 2022

(30) Foreign Application Priority Data

Sep. 30, 2020 (DE) .......................... 102020212368.3

(51) Int. Cl.
*G01R 33/58* (2006.01)
*G01R 33/54* (2006.01)
*G01R 33/56* (2006.01)

(52) U.S. Cl.
CPC ........... *G01R 33/58* (2013.01); *G01R 33/543* (2013.01); *G01R 33/5608* (2013.01)

(58) Field of Classification Search
None
See application file for complete search history.

(56) References Cited

U.S. PATENT DOCUMENTS

| 8,981,776 | B2 | 3/2015 | Setsompop et al. |
| 2017/0261582 | A1* | 9/2017 | Blasche ............ G01R 33/56341 |
| 2018/0095143 | A1* | 4/2018 | Zeller .................... G01R 33/20 |
| 2018/0143277 | A1 | 5/2018 | Chen et al. |
| 2022/0057468 | A1 | 2/2022 | Polak et al. |

OTHER PUBLICATIONS

Ferreira, Pedro F., et al. Cardiovascular magnetic resonance artefacts. Journal of Cardiovascular Magnetic Resonance, 2013, 15. Jg , Nr. 1, S. 1-39.

(Continued)

*Primary Examiner* — Rodney E Fuller
(74) *Attorney, Agent, or Firm* — Banner & Witcoff Ltd.

(57) ABSTRACT

Calibration data is determined for a reconstruction of image data from scan data acquired via a magnetic resonance system. This includes specifying acquisition shots for an acquisition of desired scan data in which acquisition shots scan data is acquired after radiating-in an RF excitation pulse, identifying first acquisition shots among the acquisition shots specified in which scan data is acquired in a central region in k-space, stipulating a sequence in which the specified acquisition shots are to be carried out such that first acquisition shots are arranged in the sequence in a starting portion to be carried out first, acquiring the scan data by carrying out the specified acquisition shots in the stipulated sequence, determining calibration data from scan data acquired in the starting portion of the sequence, and reconstructing image data using the acquired scan data and the specified calibration data.

12 Claims, 4 Drawing Sheets

(56) References Cited

OTHER PUBLICATIONS

Figure 1:
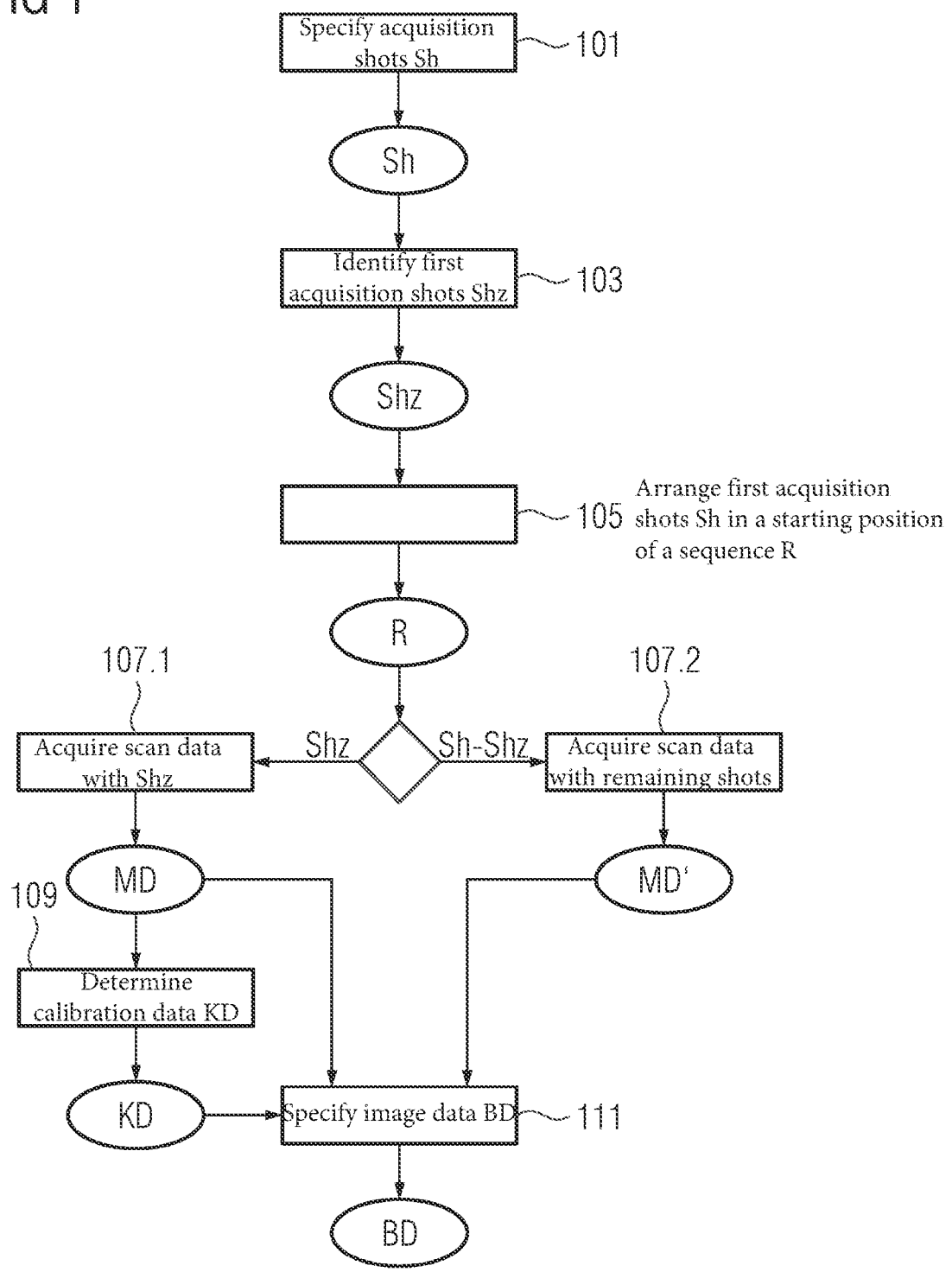

Chen et al. "Self-Calibrating Wave-Encoded Variable-Density Single-Shot Fast Spin Echo Imaging", J. Magn. Reson. Imaging 2018;47:954 966.
Setsompop, Kawin, et al.: "Blipped-controlled aliasing in parallel imaging (blipped-CAIPI) for simultaneous multislice echo planar imaging with reduced g-factor penalty"; in: Magnetic Resonance in Medicine; vol. 67,5; pp. 1210-1224; 2012; DOI 10.1002/mrm.23097; 2012.
Cauley, Stephen F. et al. "Autocalibrated Wave-CAIPI Reconstruction; Joint Optimization of k-Space Trajectory and Parallel Imaging Reconstruction" Magnetic Resonance in Medicine, vol. 78, No. 3, pp. 1093-1099, 2016 // DOI: 10.1002/mrm.26499.
Bilgic, Berkin et al., "Wave-CAIPI for Highly Accelerated 3D Imaging", Magnetic Resonance in Medicine, vol. 73, No. 6, pp. 2152-2162, 2015 // DOI: 10.1002/mrm.25347.
Gagoski, Borjan A. et al. "RARE/Turbo Spin Echo Imaging with Simultaneous Multislice Wave-CAIPI" Magnetic Resonance in Medicine; vol. 73; pp. 929-938; 2015 // DOI: 10.1002/mrm.2561.
Breuer, Felix A. et al. "Controlled Aliasing in Volumetric Parallel Imaging (2D CAIPIRINHA)", in: Magentic Resonance in Medicine, vol. 55, pp. 549-556, DOI 10.1002/mrm.20787; 2006.
German action dated Aug. 23, 2021, Application No. 10 2020 212 368.3.

\* cited by examiner

DETERMINING CALIBRATION DATA FOR A RECONSTRUCTION OF IMAGE DATA FROM SCAN DATA ACQUIRED BY MEANS OF A MAGNETIC RESONANCE SYSTEM

CROSS-REFERENCE TO RELATED APPLICATIONS

The present application claims the benefit of the filing date of Germany patent application no. DE 10 2020 212 368.3, filed on Sep. 30, 2020, the contents of which are incorporated herein by reference in their entirety.

TECHNICAL FIELD

The disclosure relates to determining calibration data for the reconstruction of image data from scan data acquired by means of a magnetic resonance system.

BACKGROUND

Magnetic resonance (MR) technology is a known technology with which images of the interior of an examination object can be generated. Expressed simply, for this purpose the examination object is positioned in a magnetic resonance device in a relatively strong, static, homogeneous main magnetic field, also known as the B0 field, with field strengths of 0.2 tesla to 7 tesla and more, so that its nuclear spins orient along the main magnetic field. To trigger nuclear spin resonances that can be measured as signals, radio frequency excitation pulses (RF pulses) are radiated into the examination object, the nuclear spin resonances produced are measured as so-called k-space data and, on the basis thereof, MR images are reconstructed or spectroscopic data is determined.

For spatial encoding of the scan data, rapidly-switched magnetic gradient fields, known as gradients, are overlaid onto the main magnetic field. A pattern that is used which defines a temporal sequence of RF pulses to be radiated in and gradients to be switched is known as a pulse sequence, or "sequence". The recorded scan data is digitized and stored as complex number values in a k-space matrix. From the k-space matrix occupied with values, an associated MR image can be reconstructed, for example, by means of a multi-dimensional Fourier transform.

SUMMARY

In general, to shorten the acquisition duration, so-called partial Fourier (PF) techniques may be used. In PF techniques, the entirety of k-space is typically not sampled, i.e. acquired, measured, scanned, or captured, but rather k-space is captured asymmetrically. This means that scan data is acquired in an encoding direction, usually in a readout direction, and non-symmetrically about the k-space center; rather, the acquisition of scan data is not carried out in an edge region (before or after the k-space center in the encoding direction). For example, the k-space can be sampled in k-space rows in the readout direction $k_x$ (RO), which extend respectively in the readout direction of values $-|k_x1|$ to $+|k_x2|$, wherein $|k_x1|>|k_x2|$ or $|k_x1|<|k_x2|$ applies.

To fill the portion of k-space not scanned with a shortened capture duration, different reconstruction methods are used. In a method known as "zero-filling", unsampled regions of k-space are filled with zeros or null values. This is a simple method, although typically it leads to an additional or enlarged unsharpness, and thus to a lessened resolution in the resultant magnetic resonance image compared with imaging techniques that detect the entirety of the k-space. Other PF methods use signal models and fill the unscanned parts of k-space on the basis of calibration data measured for a current PF scan and a signal model so that the resolution is less impaired.

So-called parallel acquisition (PPA) techniques such as GRAPPA (GeneRalized Autocalibrating Partially Parallel Acquisition) or SENSE (Sensitivity Encoding) can also be used in which, with the aid of a plurality of RF coils, only a number of scan data items undersampled in the k-space according to the Nyquist theorem are acquired, for example, to shorten the scan time necessary overall for the acquisition of the scan data or to increase the resolution. The "missing" scan data that is not sampled, but is needed for a complete set of scan data in accordance with the Nyquist theorem, is hereby enhanced on the basis of sensitivity data of the RF coils used, calibration data, and the measured scan data.

The desire for ever faster MR acquisitions in the clinical environment is leading to a resurgence of methods in which a plurality of images are acquired simultaneously. In general, these methods can be characterized in that at least during a part of the scan, targeted transverse magnetization of at least two slices is used simultaneously for the imaging process (multi-slice imaging, slice multiplexing, or simultaneous multi-slice (SMS)). In contrast thereto, in the established multi-slice imaging, the signal is acquired from at least two slices alternatingly, i.e. completely independently of one another, with correspondingly long scan times.

Known SMS methods are, for example, methods that use the aforementioned imaging by means of PPA, in which knowledge gathered from calibration data regarding the sensitivity distribution of the receiving coils used during the capture of the scan data is utilized as additional information fill in undersampled scan data according to the Nyquist method, in the slice direction, to separate signals acquired overlaid from a plurality of slices into signals of the individual slices. These methods include, for example, the CAIPIRINHA technique as described by Breuer et al. in "Controlled Aliasing in Parallel Imaging Results in Higher Acceleration (CAIPIRINHA) for Multi-Slice Imaging", in Magnetic Resonance in Medicine 53, 2005, pp. 684-691 and the blipped CAIPIRINHA technique as described by Setsompop et al. in "Blipped-Controlled Aliasing in Parallel Imaging for Simultaneous Multi-slice Echo Planar Imaging With Reduced g-Factor Penalty", in Magnetic Resonance in Medicine 67, 2012, pp. 1210-1224, wherein the g-factor (geometry factor) mentioned in the latter publication is a measure for a separability of the different receiving coils used.

As a method for further reducing the g-factor, it is also known for the CAIPIRINHA method to alter the readout trajectories in the k-space and thereby alter the acquisition scheme so that the scan data is captured along readout trajectories that proceed in a wave shape or a screw shape. This is described, for example, in U.S. Pat. No. 8,981,776, in the article by Bilgic et al. "Wave-CAIPI for Highly Accelerated 3D Imaging", Magnetic Resonance in Medicine 73:2152-2162 (2015), or, for two-dimensional (2D) imaging by Chen et al. "Self-Calibrating Wave-Encoded Variable-Density Single-Shot Fast Spin Echo Imaging", J. Magn. Reson. Imaging 2018; 47:954-966, or for spin echo (SE) methods in Gagoski et al. "RARE/Turbo Spin Echo Imaging with Simultaneous Multislice Wave-CAIPI", Magn. Reson. Med. 73:929-938 (2015).

In short, for such wave techniques during the readout process, simultaneously with a gradient in the readout direction, at least one sinusoidal-shaped modulated gradient is played out in a direction oriented perpendicularly to the readout direction. A wave-shaped or screw-shaped k-space trajectory obtained in this way distributes artifacts, e.g. aliasing artifacts that occur due to an undersampling of the k-space applied for shortening the scan time, in at least two or, for screw-shaped k-space trajectories, all spatial directions, and also enables sensitivity data of the RF coils used to be implemented in a plurality of (e.g. all three) spatial directions. This leads to the aforementioned reduction of the g-factor. Thus, with wave techniques, for example, higher accelerations and therefore a stronger undersampling may be used with a constant quality of the image data obtained as compared with non-wave-PPA techniques with a lower acceleration.

The effect of the modulated gradients, also known as wave gradients, on a magnetization m at a spatial point wave (x, y, z) may be described as a multiplication by a "point-spread function" PSF, which defines the spread of aliasing artifacts of undersampling schemes in accordance with Equation 1 below as follows:

$$\text{Wave}(x,y,z) = F_x^{-1} \text{PSF}(k_x,y,z) F_x m(x,y,z).$$  Eqn. 1:

With reference to Eqn. 1 above, $F_x$ stands for a Fourier transform, $F_x^{-1}$ represents the inverse Fourier transform, and $\text{PSF}(k_x,y,z)$ stands for the PSF for a wave gradient represented in the hybrid $k_x$-y-z-space. The PSF describes the effect of the modulated gradients on the imaging phase in the $k_x$-direction, and may be respectively separated into terms dependent upon y and z. As in the aforementioned article by Bilgic et al., aliasing artifacts may therefore be remedied through "unaliasing" by means of a SENSE reconstruction.

Ideally, the PSFs of sinusoidally or cosinusoidally modulated gradients are also sinusoidal or cosinusoidal. Therefore, a modulation transfer function (MTF) obtained through a Fourier transform of such a PSF should have only a frequency component. In reality, however, a spectrum of a real PSF described by an MTF is typically broadened by imperfections of the gradients used during the readout process, which can be caused, for example, by eddy currents and delays in the gradients switched, etc. Therefore, a reconstruction of image data that uses an ideal PSF leads to a blurring in the reconstructed image data.

Thus, wave techniques prove to be particularly sensitive to imperfections in the gradients used during the readout process, so that deviations in the gradients actually generated during a scan lead (during a readout duration) from the respective ideal gradients planned for this readout duration, lead to artifacts in the image data that is ultimately obtained.

However, such deviations of gradients actually generated during a scan during a readout duration from the respectively-planned gradients for this readout duration often occur, for example, because of high currents in the respective gradient coils and effects caused thereby such as eddy currents, higher order fields, etc.

Attempts have been made to reduce the negative effects of the aforementioned deviations by observation of known, static, constant time delays of the respective gradient coils retrospectively during the reconstruction. However, this procedure leaves frequency-dependent components of the delays in the switched gradients, and deviations caused thereby, as well as any deviations of the magnitudes achieved in the switched gradients from the planned gradients out of consideration, so that by means of this inflexible approach only an inadequate remedying of artifacts can be achieved.

Furthermore, for example, in the article by Cauley et al. "Autocalibrated Wave-CAIPI Reconstruction; Joint Optimization of k-Space Trajectory and Parallel Imaging Reconstruction", Magnetic Resonance in Medicine 78, 2017, pp. 1093-1099, an iterative method has been described which varies frequency parameters of the point-spread-function (PSF), which describes the spread of aliasing artifacts from undersampling schemes and which compares reconstruction results obtained at selected test positions with the different frequency parameters over their root mean square error (RMSE). If the RMSE approaches a local minimum, the associated value of the frequency parameter is adopted as that of the PSF being sought (e.g. the target PSF). The PSF is specified as calibration data on the basis of scan data which is, for example, part of scan data acquired in the context of the wave measurement. On the basis of the PSF found, a correction of the deviation of the gradients for wave k-space trajectories is described.

It is the object of the disclosure to enable a rapid determination of calibration data that is used for a reconstruction of image data.

The object is achieved with a method for determining calibration data for a reconstruction of image data from scan data acquired by means of a magnetic resonance system, a magnetic resonance system, a computer program and an electronically readable data carrier as described in the specification including the claims.

A method according to the disclosure for determining calibration data for a reconstruction of image data from scan data acquired by means of a magnetic resonance system comprises the following steps:

specifying acquisition shots to be carried out for an acquisition of all the desired scan data, in which scan data is acquired after radiating-in an RF excitation pulse, identifying first acquisition shots among the acquisition shots determined, in which scan data is acquired in a central region in the k-space, stipulating a sequence in which the specified acquisition shots are to be carried out one after another such that first acquisition shots are arranged in the sequence in a starting portion to be carried out first of all, acquiring the scan data by carrying out the specified acquisition shots in the stipulated sequence, determining calibration data from scan data acquired in the starting portion of the sequence, reconstructing image data on the basis of the acquired scan data and the specified calibration data.

By using a sequence according to the disclosure for acquisition shots to be performed, calibration data may already have been determined after completion of the starting portion of the sequence, and thus have been acquired even before all the scan data. The time needed for the acquisition of the remaining acquisition shots (after the starting portion) may be efficiently used for the determination process of the calibration data, so that after completion of the acquisition of all the scan data, the reconstruction of image data may be begun as soon as possible. This is advantageous for any of the aforementioned time-consuming determination processes of calibration data, for example, the aforementioned determination of PSFs as calibration data for a reconstruction of image data acquired by means of a wave technique.

A magnetic resonance system according to the disclosure comprises a magnet unit, a gradient unit, a radio frequency unit, and a control facility designed for executing one or more methods according to the disclosure with a pulse sequence adjusting unit.

A computer program according to the disclosure implements one or more methods according to the disclosure on a control facility, when executed on the control facility.

The computer program can herein also be present in the form of a computer program product, which may be directly loaded into a memory store of a control facility, having program code means to carry out one or more methods according to the disclosure when the computer program product is executed in the computer unit of the computer system.

An electronically readable data carrier according to the disclosure comprises electronically readable control information stored thereon, which comprises at least one computer program according to the disclosure and is configured such that, when the data carrier is used in a control facility of a magnetic resonance system, it executes one or more methods according to the disclosure.

The advantages and details set out in relation to the methods described herein apply accordingly for the magnetic resonance system, the computer program product, and the electronically readable data carrier.

BRIEF DESCRIPTION OF THE DRAWINGS/FIGURES

Figure 2:
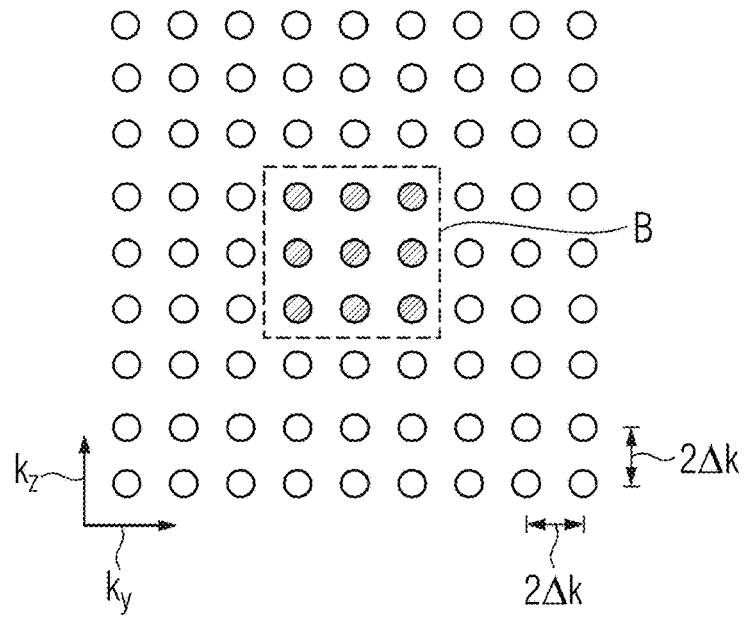
Figure 3:
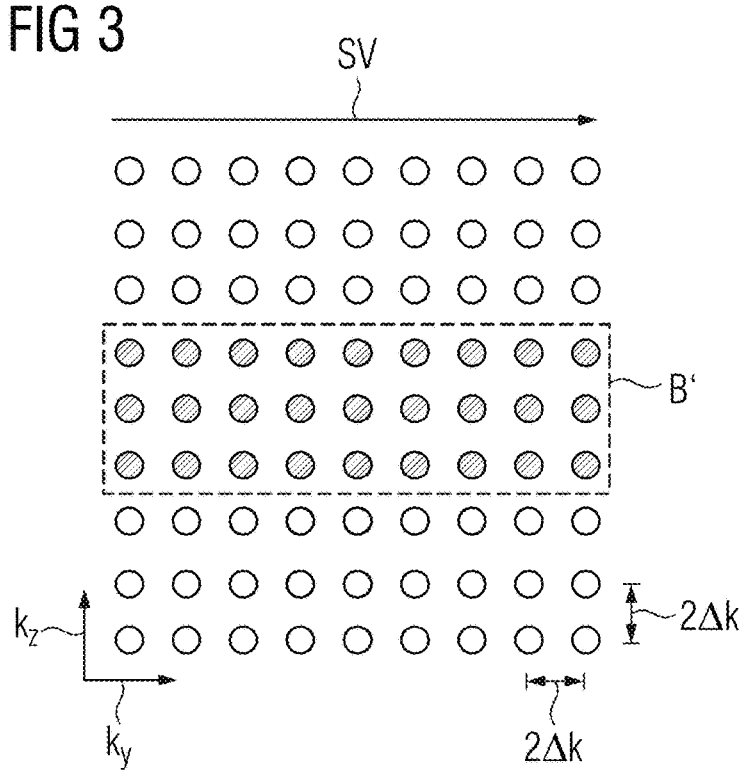
Figure 4:
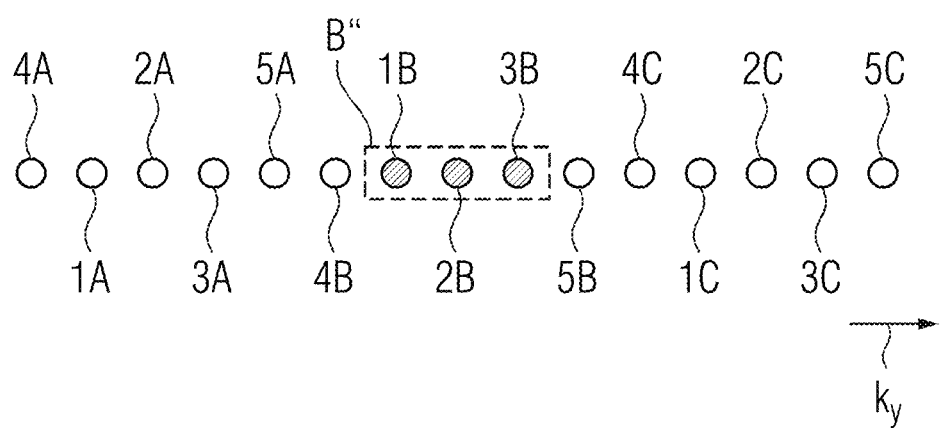
Figure 5:
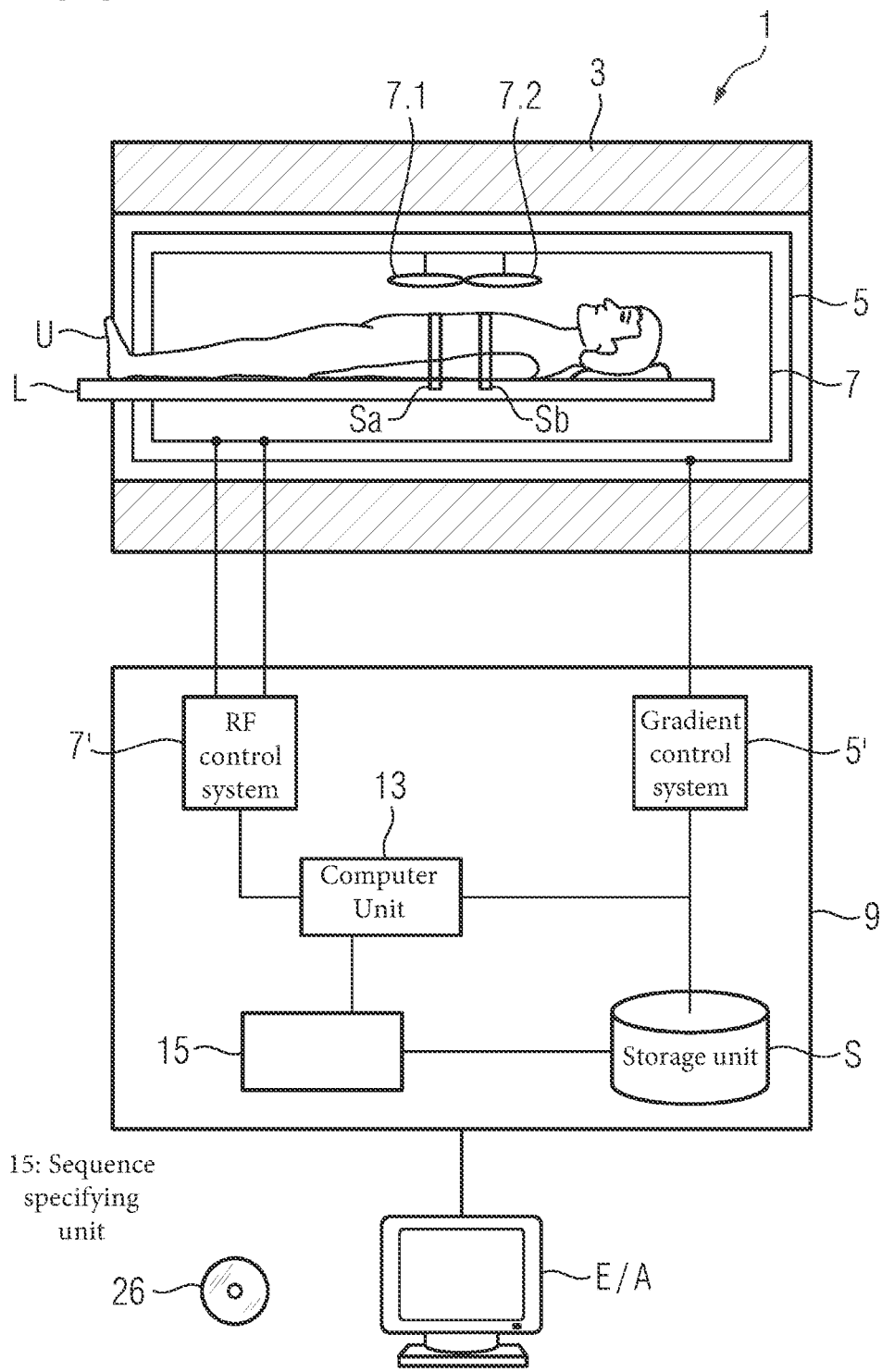

Further advantages and details of the present disclosure are disclosed in the following description of exemplary embodiments and by reference to the drawings. The examples given do not represent restrictions of the disclosure. In the drawings:

FIG. 1 shows a schematic flow diagram of a method, in accordance with one or more embodiments of the present disclosure, FIGS. 2-4 show schematically represented examples of different sampling schemes of the k-space to illustrate a sequence, in accordance with one or more embodiments of the present disclosure, FIG. 5 shows a schematically represented magnetic resonance system, in accordance with one or more embodiments of the present disclosure.

DETAILED DESCRIPTION

FIG. 1 shows a schematic flow diagram of a method, in accordance with one or more embodiments of the present disclosure for determining calibration data for a reconstruction of image data from scan data acquired by means of a magnetic resonance system.

The acquisition shots Sh (e.g. all shots) to be performed for an acquisition of the desired scan data (e.g. all scan data) are specified (block 101). In an acquisition shot, scan data is acquired after radiating-in an RF excitation pulse in each case. Such MR acquisition techniques in which the desired scan data is acquired with a plurality of acquisition shots are also designated multishot scans. Therein, in the context of an acquisition shot, an echo signal generated by the RF pulse of the acquisition shot can be acquired as scan data (single echo), or a plurality of echo signals generated by the RF pulse of the acquisition shot may be acquired as scan data (multi echo). The echo signals may be generated in the acquisition shots e.g. as spin echo signals or as gradient echo signals.

First acquisition shots Shz are identified among the specified acquisition shots Sh, in which scan data is acquired in a central region in the k-space (block 103).

The central region in the k-space may be selected dependent upon a sampling pattern of the k-space used in the acquisition of the scan data and/or dependent upon a desired resolution of the calibration data. A central region of the k-space is arranged in at least one k-space direction centrally about the k-space center. The larger the central region is selected to be, the larger the resolution achieved.

When the first acquisition shots Shz have been identified (e.g. calculated), a sequence R in which the specified acquisition shots Sh are to be performed (one after the other) is specified (e.g. calculated) such that first acquisition shots Shz are arranged in the sequence R in a starting portion of acquisition shots to be carried out (e.g. executed) first (block 105). Herein, the sequence R can be stipulated (e.g. calculated) such that first acquisition shots Shz, e.g. all the first acquisition shots Shz, are carried out in the sequence before the remaining acquisition shots (Sh-Shz) that are not first acquisition shots Shz. Thus, only first acquisition shots Shz may be carried out in the starting portion of the sequence R. A minimum number of remaining acquisition shots (Sh-Shz) may be stipulated, which in any event may only be carried out after the starting portion of the sequence. In this way, a minimum duration may be stipulated, which remains after completion of the acquisition shots contained in the starting portion and until the completion of the entire scan.

The specified acquisition shots Sh are carried out in the stipulated sequence R to acquire (block 107.1) scan data MD with the first acquisition shots Shz, and to acquire (block 107.2) scan data MD' with the remaining acquisition shots. In this way, first acquisition shots Shz are carried out as far as possible at the start of the sequence R, and the scan data MD acquired through first acquisition shots Shz is already available before all the scan data MD' is acquired by the remaining acquisition shots (Sh-Shz).

Calibration data KD is determined (block 109) from scan data acquired in the starting portion of the sequence R, e.g. from scan data MD acquired with first acquisition shots Shz. Since the calibration data KD is determined from scan data MD on the basis of which image data is also reconstructed, it is compatible with the scan data. The calibration data KD may be determined in the usual manner depending upon the type of calibration data KD desired for the scan. Therein, calibration data KD may be specified, for example, according to an acquisition technique used for the acquisition of the scan data.

If the scan data is acquired, for example, according to a wave sampling pattern, point-spread functions PSF may be determined as calibration data KD, as described, for example, in the aforementioned article by Cauley et al. Therein, however, it is disclosed that the PSFs are first determined after conclusion of a complete acquisition of all scan data, which leads to delays in the reconstruction of the image data. With the method described herein, PSFs can be determined as calibration data from the scan data MD acquired with first acquisition shots Shz (and therefore at low resolution) from the central region of the k-space before the acquisition of all the scan data is ended. Significant time can therefore be gained.

If the scan data is acquired by means of a plurality of receiving coils of the magnetic resonance system, the calibration data KD may be determined as coil specification data, for example, for a coil combination technique and/or for a coil normalization.

If the scan data is acquired by means of a parallel acquisition technique, the calibration data KD may be determined as coil sensitivity data that is used for complementing unrecorded scan data.

If the scan data is acquired by means of a partial Fourier technique, the calibration data KD may be used for filling the k-space.

In general, calibration data KD, the determination of which is computationally-intensive and therefore demands long computation times, may advantageously be determined, since with the sequence R used after completion of the starting portion until the end of the entire scan, time is available for the determination.

On the basis of the scan data MD and MD' acquired and the calibration data KD specified, image data BD is specified (block 111).

FIGS. 2 to 4 schematically show examples of different k-space sampling schemes as can be utilized in a method according to one or more embodiments of the present disclosure.

Shown in FIG. 2 with empty or filled circles are k-space positions in the ky-kz plane, at which scan data is acquired in an acquisition shot. Therein, the k-space can extend further into the kx-direction lying perpendicularly to the ky-kz plane (not shown), e.g. as a k-space line or as a helically-shaped (i.e. screw) wave trajectory. The k-space positions are arranged at regular spacings in the ky and kz-directions, wherein the k-space center ky=0, kz=0 is in the center of the k-space as shown. The sampling scheme shown can be an undersampled sampling scheme, as is indicated, by way of example, by the spacings 2Δk of the k-space points from one another in the ky and kz-direction. The k-space points arranged in a central region B (shown filled) correspond to k-space trajectories which are sampled with first acquisition shots for an acquisition of scan data. Herein, all the scan data acquired with first acquisition shots may be acquired in the central region in the k-space.

A sampling scheme according to FIG. 2 may be used for acquisitions of scan data with sequences for which a signal decay between adjacent k-space positions does not have to be taken into account, e.g. in typical gradient echo sequences or spin echo sequences.

If such a signal decay is to be taken into account, e.g. because for each kz-coordinate, scan data of all the associated k-space positions are acquired with different ky-coordinates one after another in an echo train, a sampling scheme shown in FIG. 3 can be utilized.

Also shown in FIG. 3 with empty or filled circles are k-space positions in the ky-kz plane. Here, however, scan data is acquired in one acquisition shot for all k-space positions with the same kz-coordinates. Therein, the k-space can also extend further into the kx-direction lying perpendicularly to the ky-kz plane (not shown), for example, as a k-space line or as a helically shaped wave trajectory. The k-space positions are arranged at regular spacings in the ky and kz directions, wherein the k-space center ky=0, kz=0 is situated in the center of the k-space as shown. The sampling scheme shown may again be an undersampled sampling scheme, as is indicated, by way of example, by the spacings 2Δk of the k-space points from one another in the ky and kz-directions.

In the phase encoding direction ky, as indicated by the arrow, a signal decay SV is to be taken into account. Therefore, the central region B' of the k-space extends over the entire width of the sampled k-space in the ky-direction. The k-space points arranged in a central region B' (shown filled) correspond to k-space trajectories which are sampled with first acquisition shots per kz-coordinate for an acquisition of scan data. Herein, all the scan data acquired with first acquisition shots may be acquired in the central region in the k-space.

A sampling scheme of this type may be utilized, for example, if the k-space positions are traversed in nested loops, in each case, over the ky and the kz directions sequentially, for example if, as shown, a loop is traversed by means of the different ky-positions within a loop via the different kz-positions.

A sampling scheme according to FIG. 3 may be used, for example, on acquisition of scan data with sequences from the group of MPRAGE (magnetization-prepared rapid gradient-echo imaging) sequences, SPACE (sampling perfection with application optimized contrasts using different flip angle evolution) sequences (3D) HASTE (half-Fourier acquired single turbo spin echo) sequences or even (3D) TSE (turbo spin echo) sequences.

Further sampling schemes, which are also more complex, for example, non-regular in the ky-kz plane, which however still follow the principle that a coherent central region may be defined in the k-space which is sampled, in the sequence according to the disclosure, in a starting portion, to acquire scan data.

FIG. 4 shows a simplified example of a 2D sampling scheme which samples the k-space in the ky-kx plane.

Also shown in FIG. 4, with empty or filled circles, are k-space positions in the ky-kz plane. Therein, the k-space extends further into the kx-direction (not shown) lying perpendicularly to the ky-kz plane, for example, as a k-space line or as a helically shaped wave trajectory. The k-space positions are again arranged at regular spacings in the ky and kz directions, wherein the k-space center ky=0 is situated in the center of the k-space as shown. The sampling scheme shown may further be an undersampled sampling scheme.

The k-space positions may be acquired in a linear manner by means of acquisition shots, each of which acquires a number of echo signals. In the simplified example shown, the 15 k-space positions shown can be sampled, for example, in five acquisition shots (1 to 5), each of which acquires three echo signals A, B, C as scan data. The k-space positions are identified with a number from 1 to 5 (for the associated acquisition shot) and a letter A, B, or C for the associated echo signal. The sequence of the acquisition shots has been selected here such that the k-space positions lying in a central region B" of the k-space shown filled are acquired with the first three first acquisition shots 1, 2, and 3 (in any sequence). The first three acquisition shots 1, 2, and 3 are first acquisition shots according to the disclosure. Herein, in the first acquisition shots, scan data is acquired in the central region B" in k-space and, for the echo signals A and C, in a region outside the central region B" in k-space. After completion of the acquisition of scan data with the first acquisition shots 1, 2, and 3, calibration data can be determined while still further acquisition shots 4 and 5 (in any order) are carried out in parallel to acquire all the desired scan data.

A sampling scheme of this type may be used, for example, with a 2D multishot sequence, for example, a 2D-TSE.

FIG. 5 schematically represents a magnetic resonance system 1 according to the disclosure. This system comprises a magnet unit 3 (e.g. a magnet and/or associating drivers and hardware components) for generating the main magnetic field, a gradient unit 5 (e.g. gradient generation circuitry, which may include one or more processors, processing circuitry, hardware, software, executable instructions, or combinations of these) for generating the gradient fields, a radio frequency unit 7 (e.g. RF generation circuitry, which may include one or more processors, processing circuitry, hardware, software, executable instructions, or combinations of these) for radiating in and receiving radio frequency signals and a control facility 9 (e.g. a computing device, controller, and/or control circuitry, which may include one or more processors, processing circuitry, hardware, software, executable instructions, or combinations of these) configured for carrying out a method according to the disclosure.

FIG. 5 is a schematic depiction of partial units (e.g. subunits) of the magnetic resonance system 1, and may include additional, or alternate components. For instance, the radio frequency unit 7 may include a plurality of subunits, for example, a plurality of coils such as the schematically shown coils 7.1 and 7.2 or more coils which can be configured to transmit radio frequency signals and/or to receive the triggered radio frequency signals.

To examine an examination object U, for example a patient or a phantom, the patient or phantom may be introduced on a support L into the magnetic resonance system 1, in the scanning volume thereof. The slice or the slab Si represents an exemplary target volume of the examination object from which echo signals are to be acquired and captured as scan data.

The control facility 9 serves to control the magnetic resonance system 1 and can, in particular, control the gradient unit 5 by means of a gradient control system 5' (e.g. gradient control circuitry, which may include one or more processors, processing circuitry, hardware, software, executable instructions, or combinations of these) and the radio frequency unit 7 by means of a radio frequency transmitting/receiving control system 7' (e.g. RF transmission/reception circuitry, which may include one or more processors, processing circuitry, hardware, software, executable instructions, or combinations of these). The radio frequency unit 7 may comprise a plurality of channels on which signals can be transmitted or received.

The radio frequency unit 7 is responsible, together with its radio frequency transmitting/receiving control system 7' for the generation and radiating-in (transmission) of a radio frequency alternating field for manipulation of the spin in a region to be manipulated (for example, in slices S to be scanned) of the examination object U. Herein, the center frequency of the radio frequency alternating field, also designated the B1 field, is typically adjusted so that, as far as possible, it lies close to the resonance frequency of the spin to be manipulated. Deviations of the center frequency from the resonance frequency are referred to as off-resonance. To generate the B1 field, in the radio frequency unit 7, currents controlled by means of the radio frequency transmitting/receiving control system 7' are applied to the HF coils.

Furthermore, the control facility 9 comprises a sequence specifying unit 15 (e.g. sequence specifying circuitry, which may include one or more processors, processing circuitry, hardware, software, executable instructions, or combinations of these) with which a sequence according to the disclosure of shots to be performed in the context of an MR scan can be specified (e.g. determined, identified, or otherwise calculated). The control facility 9 is configured overall to carry out any of the methods according to the disclosure.

A computer unit 13 (e.g. a computing device, controller, and/or control circuitry, which may include one or more processors, processing circuitry, hardware, software, executable instructions, or combinations of these) comprised by the control facility 9 is configured to carry out all the computation operations necessary for the required scans and specifications. Intermediate results and results for this or determined herein can be stored in a storage unit S of the control facility 9. The units shown are herein not necessarily to be understood as physically separate units, but represent merely a subdivision into units of purpose which, however, can also be realized, for example, in fewer, or even only in one, physical unit.

By means of an input/output facility E/A of the magnetic resonance system 1, for example, control commands can be passed by a user to the magnetic resonance system and/or results from the control facility 9 such as, for example, image data can be displayed.

A method described herein can also exist in the form of a computer program product (e.g. a non-transitory computer-readable medium), which comprises a program and implements the described method on a control facility 9 when said program is executed on the control facility 9. An electronically readable data carrier 26 (e.g. a non-transitory computer-readable medium), with electronically readable control information stored thereon can also be provided, said control information comprising at least one computer program product as described above and being configured to carry out the method described when the data carrier 26 is used in a control facility 9 of the magnetic resonance system 1.

What is claimed is:

1. A method for reconstructing image data from scan data acquired via a magnetic resonance system, comprising:
    calculating acquisition shots to be executed for an acquisition of scan data that is acquired after radiating-in a radio-frequency (RF) excitation pulse;
    identifying first acquisition shots from among the acquisition shots in which scan data is acquired in a central region of k-space,
    calculating a sequence in which the specified calculated acquisition shots are executed one after another such that the first acquisition shots are arranged in a starting portion of the sequence of acquisition shots to be executed first;
    acquiring the scan data by executing the acquisition shots in accordance with the calculated sequence;
    determining calibration data from a portion of the acquired scan data corresponding to the starting portion of the sequence; and
    reconstructing the image data using the acquired scan data and the calibration data.

2. The method as claimed in claim 1, wherein the sequence is calculated such that the first acquisition shots are executed in the sequence before acquisition shots from among the acquisition shots other than the first acquisition shots.

3. The method as claimed in claim 1, wherein the central region in k-space is selected dependent upon (i) a sampling pattern of k-space used in the acquisition of the scan data, and/or (ii) a predetermined resolution of the calibration data.

4. The method as claimed in claim 1, wherein the portion of the acquired scan data associated with the first acquisition shots is acquired in the central region of k-space.

5. The method as claimed in claim 1, wherein the portion of the acquired scan data associated with the first acquisition shots is further acquired in a region outside of the central region of k-space.

6. The method as claimed in claim 1, wherein the calibration data is determined according to an acquisition technique that is used for the acquisition of the scan data.

7. The method as claimed in claim 1, wherein the scan data is acquired according to a wave sampling pattern, and
wherein the calibration data is determined as a point-spread function.

8. The method as claimed in claim 1, wherein the scan data is acquired via a plurality of receiving coils of the magnetic resonance system, and
wherein the calibration data is determined using coil specification data for (i) a coil combination technique, and/or (ii) a coil normalization.

9. The method as claimed in claim 1, wherein the scan data is acquired via a parallel acquisition technique, and
wherein the calibration data is determined as coil sensitivity data.

10. The method as claimed in claim 1, wherein the scan data is acquired via a partial Fourier technique, and
wherein the calibration data is used for filling the k-space.

11. A magnetic resonance system, comprising:
a main magnet; and
control circuitry configured to control the magnetic resonance system to reconstruct image data from scan data acquired via a magnetic resonance system by:
calculating acquisition shots to be executed for an acquisition of scan data that is acquired after radiating-in a radio-frequency (RF) excitation pulse;
identifying first acquisition shots from among the acquisition shots in which scan data is acquired in a central region of k-space,
calculating a sequence in which the specified calculated acquisition shots are executed one after another such that the first acquisition shots are arranged in a starting portion of the sequence of acquisition shots to be executed first;
acquiring the scan data by executing the acquisition shots in accordance with the calculated sequence;
determining calibration data from a portion of the acquired scan data corresponding to the starting portion of the sequence; and
reconstructing the image data using the acquired scan data and the calibration data.

12. A non-transitory computer-readable medium having instructions stored thereon that, when executed by control circuitry of a magnetic resonance system, cause the magnetic resonance system to reconstruct image data from scan data acquired via a magnetic resonance system by:
calculating acquisition shots to be executed for an acquisition of scan data that is acquired after radiating-in a radio-frequency (RF) excitation pulse;
identifying first acquisition shots from among the acquisition shots in which scan data is acquired in a central region of k-space,
calculating a sequence in which the specified calculated acquisition shots are executed one after another such that the first acquisition shots are arranged in a starting portion of the sequence of acquisition shots to be executed first;
acquiring the scan data by executing the acquisition shots in accordance with the calculated sequence;
determining calibration data from a portion of the acquired scan data corresponding to the starting portion of the sequence; and
reconstructing the image data using the acquired scan data and the calibration data.

\* \* \* \* \*